United States Patent
Li et al.

(10) Patent No.: US 10,432,317 B2
(45) Date of Patent: Oct. 1, 2019

(54) PHOTOVOLTAIC CELL AS ENERGY SOURCE AND DATA RECEIVER

(71) Applicant: INTERNATIONAL BUSINESS MACHINES CORPORATION, Armonk, NY (US)

(72) Inventors: Ning Li, White Plains, NY (US); Devendra K. Sadana, Pleasantville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/591,423

(22) Filed: May 10, 2017

(65) Prior Publication Data
US 2018/0331766 A1 Nov. 15, 2018

(51) Int. Cl.
*H01L 31/147* (2006.01)
*H04B 10/60* (2013.01)
*H01L 31/0693* (2012.01)

(52) U.S. Cl.
CPC ......... *H04B 10/60* (2013.01); *H01L 31/0693* (2013.01); *H01L 31/147* (2013.01)

(58) Field of Classification Search
CPC . H01L 2924/00014; H01L 2224/73265; H01L 2924/00; H01L 2224/49107; H01L 2224/05001; H01L 31/0693; H01L 31/147; Y02E 10/544; H04B 10/60
USPC ....................................................... 398/214
See application file for complete search history.

(56) References Cited

U.S. PATENT DOCUMENTS

| | | | | |
|---|---|---|---|---|
| 6,300,558 | B1* | 10/2001 | Takamoto | H01L 31/0735 136/249 |
| 2011/0108082 | A1* | 5/2011 | Werthen | H01L 31/0693 136/244 |
| 2011/0186115 | A1* | 8/2011 | Wanlass | H01L 31/06875 136/255 |
| 2012/0160312 | A1* | 6/2012 | Arakawa | B82Y 20/00 136/255 |
| 2012/0223290 | A1* | 9/2012 | Iguchi | B82Y 20/00 257/21 |
| 2013/0112275 | A1* | 5/2013 | Hekmatshoar-Tabari | H01L 21/0262 136/261 |
| 2013/0298976 | A1* | 11/2013 | Chang | H01L 31/02168 136/255 |
| 2014/0150857 | A1* | 6/2014 | Yu | H01L 31/0725 136/255 |
| 2015/0162478 | A1* | 6/2015 | Fafard | H01L 31/0304 257/461 |
| 2017/0358377 | A1* | 12/2017 | Cabauy | G21H 1/06 |

* cited by examiner

*Primary Examiner* — Don N Vo
(74) *Attorney, Agent, or Firm* — Tutunjian & Bitetto, P.C.; Erik Johnson

(57) ABSTRACT

A device including a combination photovoltaic device and optical receiver comprising a p-n junction of type III-V semiconductor material layers, wherein the p-n junction produces power in response to the application of a wavelength of light for powering an optical receiver provided by the p-n junction for receiving data. The device may further include a light emitting diode for transmitting data. The device can further include a processor coupled to a memory, the processor being configured to control the electrical communication with the light emitting diode and the combination photovoltaic device and optical receiver.

20 Claims, 3 Drawing Sheets

PHOTOVOLTAIC CELL AS ENERGY SOURCE AND DATA RECEIVER

BACKGROUND

Technical Field

The present invention generally relates to photovoltaic devices, and more particularly to photovoltaic devices for receiving light for power generation in combination with an optical receiver for receiving optical signals.

Description of the Related Art

A photovoltaic device is a device that converts the energy of incident photons to electromotive force (e.m.f.). Photovoltaic devices include solar cells, which are configured to convert the energy in the electromagnetic radiation from the sun to electric energy.

SUMMARY

In one aspect, a device is provided that functions as a photovoltaic cell and an optical receiver. The device may have dimension to provide a small footprint that can fit within a 100 micron by 100 micron area. In some embodiments, the device may include a p-n junction of first type III-V semiconductor material layers; and a window layer of a second type III-V semiconductor material on the light receiving end of the p-n junction. The p-n junction produces power in response to the application of a wavelength of light for powering an optical receiver provided by the p-n junction.

In another aspect, a device is provided that includes a combination photovoltaic device and optical receiver. The combination photovoltaic device includes a p-n junction of type III-V semiconductor material layers. The p-n junction produces power in response to the application of a wavelength of light for powering an optical receiver provided by the p-n junction for receiving data. The device also includes a light emitting diode for transmitting data; and a processor coupled to a memory. The processor is configured to control electrical communication with the light emitting diode and the combination photovoltaic device and optical receiver.

In another aspect, a method for receiving optical data is provided that includes providing a material stack including p-n junction of type III-V semiconductor material layer having a microscale footprint, wherein the material stack provides a photovoltaic device and an optical receiver. The method may continue with receiving a wavelength with the p-n junction, wherein the wavelength of light when absorbed by the p-n junction of the material stack provides a power via the photovoltaic device. In a following step, the method continues with receiving optical signals with the optical receiver, wherein the optical receiver is powered by the power produced by the photovoltaic device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
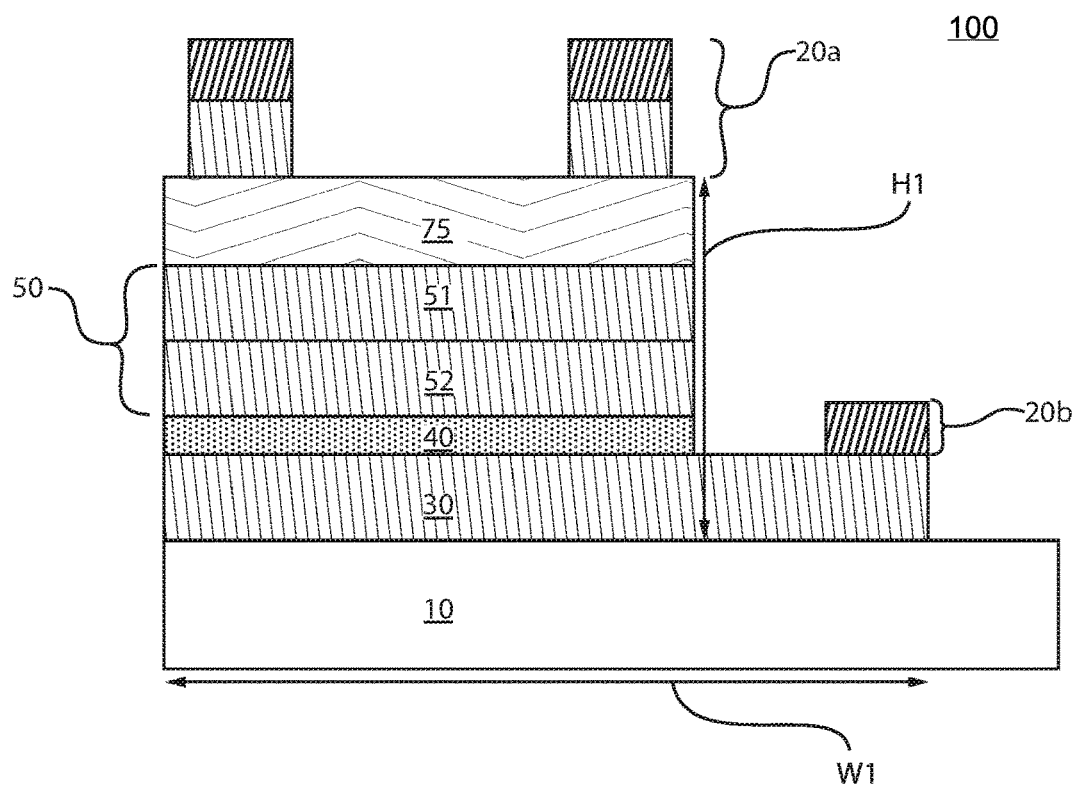
FIG. 1 is a side cross-sectional view of a device that can include a p-n junction of first type III-V semiconductor material layers; and a window layer of a second type III-V semiconductor material on the light receiving end of the p-n junction, wherein the p-n junction produces power in response to the application of a the wavelength of light for powering an optical receiver provided by the p-n junction.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying". "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure provides photovoltaic cells, i.e., photovoltaic devices, needed for internet of things (IOT) applications. The material stack including a p-n junction for the photovoltaic device also provides an optical receiver. Autonomous small sensors and internet of things (IOT) applications utilize an energy source and can employ data communication. Optical energy harvesting is among the most efficient options. Optical communications is preferred for IOT applications due to the small footprint afforded by that type of device.

As used herein, a "photovoltaic device" is a device, such as a solar cell, that produces free electrons and/or vacancies, i.e., holes, when exposed to radiation, such as light, and results in the production of an electric current. A multi-junction photovoltaic device typically includes a multiple junctions of a semiconductor layer of a p-type conductivity that shares an interface with a semiconductor layer of an n-type conductivity, in which the interface provides an electrical junction.

A photodiode is a p-n junction or PIN structure. When a photon of sufficient energy strikes the diode, it creates an electron-hole pair. This mechanism is also known as the inner photoelectric effect. If the absorption occurs in the junction's depletion region, or one diffusion length away from it, these carriers are swept from the junction by the built-in electric field of the depletion region. Thus holes move toward the anode, and electrons toward the cathode, and a photocurrent is produced. The total current through the photodiode is the sum of the dark current (current that is generated in the absence of light) and the photocurrent, so the dark current must be minimized to maximize the sensitivity of the device. The photodiode provided by the p-n junction may be employed as an optical "optical receiver".

The devices described herein can provide both a photovoltaic device and optical receiver simultaneously within a small footprint. In one example, the combination photovoltaic device and optical receiver that are described herein will have a footprint, i.e., width by length dimension, of 100 mircons×100 microns. The details of the methods and structures of the present disclosure are now described with greater detail with reference to FIGS. 1-5.

FIG. 1 depicts one embodiment of a device 100 that provides both a photovoltaic device and an optical receiver in the same material stack, in which the device 100 includes a p-n junction 50 of first type III-V semiconductor material layers and a window layer 75 of a second type III-V semiconductor material. The window layer 75 is the light receiving end of the device. The device 100 further includes a back surface field (BSF) layer 40, and a buffer layer 30. The BSF layer 40 is present on the side of the p-n junction 50 that is opposite the side of the p-n junction that is in contact with the window layer 75. The buffer layer 30 is present between the BSF layer 40 and a supporting substrate 10. The width and depth (also referred to as length) dimensions are selected to provide that the base of the device 100 has a footprint that can be equal to 100 microns by 100 microns.

The width W1 of the device 100 may range from 500 nm to 150 microns. In other examples, the depth D1 of the window layer 75 may be equal to 500 nm, 750 nm, 1000 nm, 5 microns, 50 microns, 75 microns, 100 microns, 125 microns, and 150 microns, or any range of thicknesses having an upper limit and lower limit provided by the aforementioned examples.

The depth dimension is the dimension that is perpendicular to both the height H1 and width dimension W1, i.e., is in a direction heading into and out of the page that FIG. 1 is illustrated on. In some examples, the depth may range from 500 nm to 150 microns. In other examples, the depth of the device 100 may be equal to 500 nm, 750 nm, 1000 nm, 5 microns, 50 microns, 75 microns, 100 microns, 125 microns, and 150 microns, or any range of thicknesses having an upper limit and lower limit provided by the aforementioned examples. It is noted, that the above examples for the window layer 75 having the microscale cross sectional area are provided for illustrative purposes only, and are not intended to limit the present disclosure, but are indicative of the type of dimensions that provide the increased fill factor, and for increasing the charge that can be extracted from the photovoltaic device in response to focused light and laser light applications.

The p-n junction 50 of the device can be composed of a type III-V semiconductor material layer, and the window layer 75 may also be composed of a type III-V semiconductor material. The term "III-V semiconductor material" denotes a semiconductor material that includes at least one element from Group IIIB of the Periodic Table of Elements under the Old International Union of Pure and Applied Chemistry (IUPAC) classification system, or Group 13 of the New International Union of Pure and Applied Chemistry classification system; and at least one element from Group VB of the Periodic Table of Elements, or Group 15 of the New International Union of Pure and Applied Chemistry classification system. In some embodiments, the III-V semiconductor material may be selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

In some embodiments, the photovoltaic device is composed of a p-n junction 50 of a first type III-V semiconductor material layers and a window layer 75 of a second type III-V semiconductor material on the light receiving end of the p-n junction, wherein the second type III-V semiconductor material has a greater band gap than the first type III-V semiconductor material. The term "first type" and "second type" when describing the composition of the material layers for the window layer 75 and the p-n junction 50 mean that the composition for the window layer 75 and the p-n junction 50 are different. For example, the window layer 75 can be composed of aluminum gallium arsenide (AlGaAs), indium gallium arsenide (InGaAs) or indium gallium phosphide (InGaP); and the p-n junction 50 may be composed of material layers, i.e., an emitter layer 51 and a base layer 52, that are composed of gallium arsenide (GaAs). The material layers for the p-n junction 50 are selected so that the window layer 75 is composed of a semiconductor material having a greater band gap, i.e., wider band gap, than the material layers of the p-n junction 50. A "band gap", also called an energy gap or bandgap, is an energy range in a solid where no electron states can exist. Plotted in a graph, the band gap is the energy difference (in electron volts) between the top of the valence band and the bottom of the conduction band in insulators and semiconductors. It is the energy to promote a valence electron bound to an atom to become a conduction electron, which is free to move within the crystal lattice and serve as a charge carrier to conduct electric current. For example, gallium arsenide (GaAs) as used in the p-n junction 50 has a band gap of 1.39 eV, while aluminum gallium arsenide (AlGaAs) as a material for the window layer 75 has a band gap that can range from 1.42 eV to 2.16 eV, which is greater than the band gap of gallium arsenide, as used for the p-n junction 50. By selecting that the window layer 75 is composed of a greater band gap material than the p-n junction 50, a majority of the light passes through the window layer 75 to the p-n junction 50, at which the light is absorbed.

The window layer 75 can be in direct contact with an emitter layer 51 of the p-n junction 50. The emitter layer 51 of the p-n junction has a first conductivity type and is in direct contact with a base layer 52 that has a second conductivity type. In some embodiments, the window layer 75 has a same conductivity type. i.e., first conductivity type, as the emitter layer 51. The term "conductivity type" when describing a semiconductor material denotes that the material is doped to an n-type conductivity or a p-type conductivity. In the example that is depicted in FIG. 1, the first type conductivity of the window layer 75a and the emitter layer 51 of the p-n junction 50 is an n-type conductivity type, while the second conductivity type of the base layer 52 of the p-n junction 50 is a p-type conductivity type. As used herein. "p-type" refers to the addition of impurities to an intrinsic semiconductor that creates deficiencies of valence electrons. As used herein, "n-type" refers to the addition of impurities that contributes free electrons to an intrinsic semiconductor. In a type III-V semiconductor material, the effect of the dopant atom. i.e., whether it is a p-type or n-type dopant, depends upon the site occupied by the dopant atom on the lattice of the base material. In a III-V semiconductor material, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities.

It is noted that the above examples of the conductivity types for the window layer 75 and the p-n junction 50 are provided for illustrative purposes only, and are not intended to limit the present disclosure to only those conductivity types. For example, the window layer 75 and the emitter layer 51 of the p-n junction 50 can also be p-type, while the base layer 52 of the p-n junction 50 can also be n-type.

The emitter layer 51 of the first conductivity type, i.e., n-type, is in direct contact with a base layer 52 of the second conductivity type, i.e., p-type, wherein due to this joining, excess electrons from n-type try to diffuse with the holes of p-type whereas excess hole from p-type try to diffuse with the electrons of n-type. Movement of electrons to the p-type side exposes positive ion cores in the n-type side of the p-n junction 50, while movement of holes to the n-type side exposes negative ion cores in the p-type side of the p-n junction 50, resulting in an electron field at the junction and forming the depletion region. Absorption of incident photons at the p-n junction 50 create electron-hole pairs, in which electron-hole pairs generate in the solar cell provided that the incident photon has an energy greater than that of the band gap. Collection of these carriers by the p-n junction prevents recombination by using a p-n junction to spatially separate the electron and the hole. The carriers are separated by the action of the electric field existing at the p-n junction. If the light-generated minority carrier reaches the p-n junction, it is swept across the junction by the electric field at the junction, where it is now a majority carrier. If the emitter and base of the solar cell are connected together (i.e., if the solar cell is short-circuited), then the light-generated carriers flow through the external circuit.

The collection of light-generated carriers does not by itself give rise to power generation. In order to generate power, a voltage must be generated as well as a current. Voltage is generated in a solar cell by a process known as the "photovoltaic effect." The collection of light-generated carriers by the p-n junction 50 causes a movement of electrons to the n-type side and holes to the p-type side of the junction. Under short circuit conditions, the carriers exit the device as light-generated current.

The window layer 75 can have that may range from 500 nm to 3 microns. In other examples, the thickness T1 of the window layer 75a may be equal to 500 nm, 600 nm, 700 nm, 800 nm, 900 nm, 1 micron, 1.25 microns, 1.5 microns, 1.75 microns, 2 microns and 3 microns, or any range of thicknesses having an upper limit and lower limit provided by the aforementioned examples.

The emitter layer 51 of the p-n junction 50 can have a thickness that is less than the window layer 75a. The emitter layer 51 also has a thickness that is less than the thickness of the base layer 52. In some embodiments, the thickness of the emitter layer 51 is selected to be 500 nm or less. In some embodiments, the thickness of the emitter layer 51 may range from 50 nm to 250 nm. In one example, the thickness of the emitter layer 51 may be equal to 100 nm.

In contrast to the emitter layer 51, the base layer 52 typically has a macroscale thickness. By "macroscale" it is meant that the thickness is greater than 1 micron. In some embodiments, the thickness of the base layer 52 is 1 micron or greater. For example, the thickness of the base layer 52 can range from 1 micron to 10 microns. In some embodiments, the thickness of the base layer 52 ranges from 2 microns to 5 microns. In one example, the thickness of the base layer 52 is 3 microns.

The base layer 52 of the p-n junction 50 may be in direct contact with a back surface field (BSF) layer 40. The back surface field (BSF) layer 40 can be composed of the same base semiconductor material as the window layer 75a. In some embodiments, the window layer 75a is used in order to reduce the surface recombination velocity. Similarly, a back-surface field (BSF) layer 40 reduces the scattering of carriers towards the tunnel junction. Further, both the window layer 75a and BSF layers 40 can be transparent to wavelengths absorbed by the next p-n junction. The back surface field (BSF) layer 40 can be composed of aluminum gallium arsenide (AlGaAs), and can have a thickness ranging from 100 nm to 3 microns. The BSF layer 40 can have a same conductivity type as the base layer 52 of the p-n junction 50. For example, the BSF layer 40 can be doped to an n-type conductivity type.

In some embodiments, a buffer layer 30 may be present between the (BSF) layer 40 and the substrate 10. The buffer layer 30 is typically composed of a semiconductor material having a lattice dimension between the supporting substrate 10 and the BSF layer 40. For example, the buffer layer 30 may be composed of gallium arsenide. The conductivity type of the buffer layer 30 is typically the same as the conductivity type of the back surface filed layer 40. For example, if the base layer 52 of the p-n junction is n-type, the BSF layer 40 is also n-type, and the buffer layer 30 is also n-type.

The supporting substrate 10 is present at the end of the photovoltaic device that is opposite the light receiving end of the device, at which the window layer 75a is present. The supporting substrate 10 is composed of an electrically conductive semiconductor material. For example, the supporting substrate 10 may be composed of a type IV semiconductor material, such as silicon or germanium or silicon germanium, or a type III-V semiconductor material. In one example, the supporting substrate 10 is composed of p-type gallium arsenide.

Still referring to FIG. 1, in some embodiments, the photovoltaic device 100 includes contacts 20a, 20b. The first set of contact 20a is in direct contact with the window layer 75, and includes a bilayer of a type III-V semiconductor material, such as gallium arsenide (GaAs), and an metal containing layer, such as a metal layer or metal semiconductor alloy. The second set of contacts 20b are in direct contact with the supporting substrate 10 and similar to the first set of contacts 20b may be composed of a bilayer of a bilayer of a type III-V semiconductor material, such as gallium arsenide (GaAs), and an metal containing layer, such as a metal layer or metal semiconductor alloy. The metal of the metal containing layer may be aluminum, copper, titanium, tungsten and combinations thereof.

Figure 2:
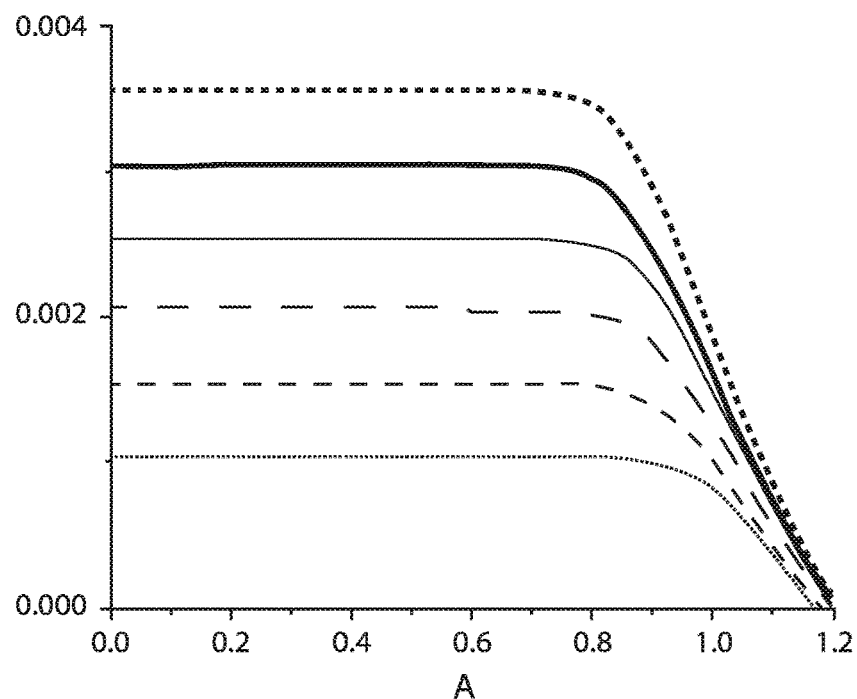
FIG. 2 is a plot illustrating the maximum power that can be produced by the photovoltaic device of the structure depicted in FIG. 1.

The device 100 can function as a photovoltaic device that can produce a direct current (DC) of 1.7 volts. The wavelength of light absorbed by the p-n junction 50 can range from 300 nm to 900 nm. In some other embodiments, the wavelength of light absorbed by the p-n junction 50 can range from 400 nm to 850 nm. The device 100 having dimensions to provide an approximate 100 micron by 100 micron footprint can provide a voltage at open circuit (Voc) that is equal to 1.18V as illustrated by FIG. 2. In some other examples, the voltage at open circuit may range from 0.75 V to 1.25 V. Further, the max output power can be as greater as 3.0 mW. In some other examples, the max output power can range from 2.75 mW to 3.25 mW. The power and voltage production from the photovoltaic cell provided by the p-n junction 50 is sufficient to function as a power source (similar to a battery) for powering the optical receiver function of the device 100. In some embodiments, the power and voltage production of the photovoltaic cell provided by the p-n junction can also power processors, memory devices, and light emitting diodes that are integrated with the device 100 that is depicted in FIG. 1.

Figure 3:
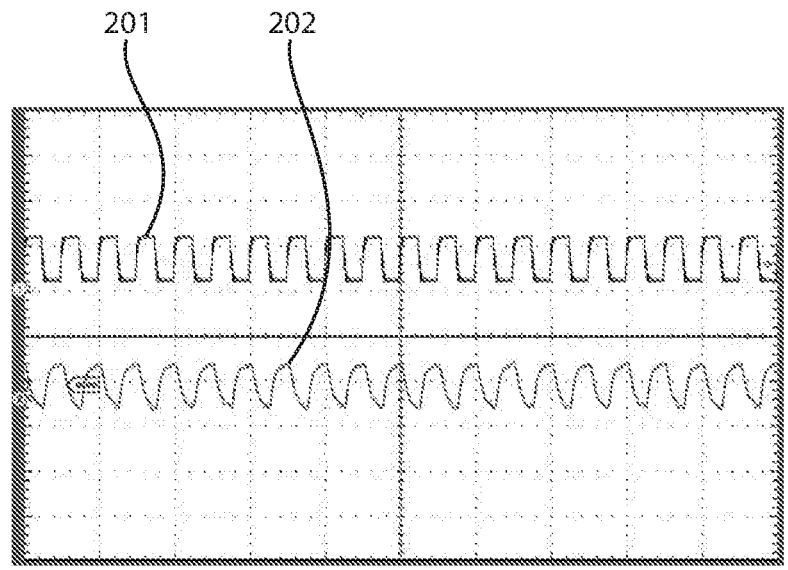
FIG. 3 is a plot of AC power used to power an optical receiver that can be produced by the photovoltaic device of the structure depicted in FIG. 1, in accordance with one embodiment of the present disclosure.
Figure 4:
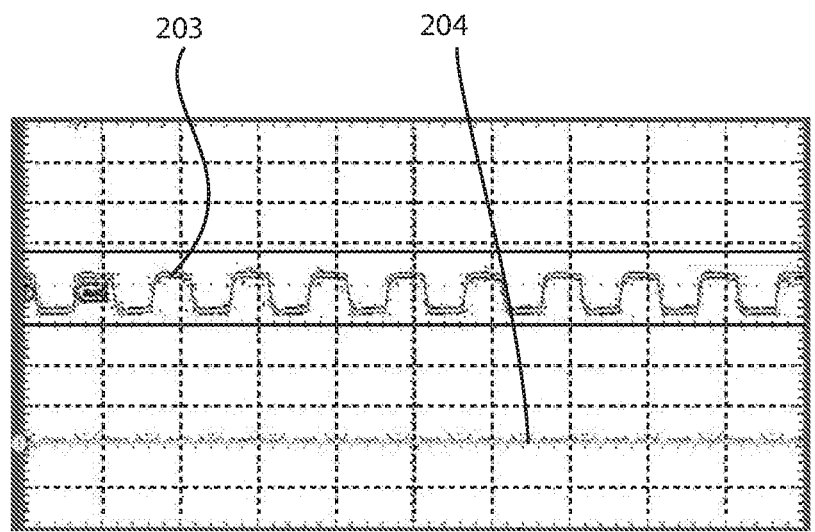
FIG. 4 is a plot of AC power as used to power an optical receiver, as depicted in FIG. 1, and a plot of PC power as produced by the photovoltaic device, as depicted in FIG. 1, in accordance with one embodiment of the present disclosure.

FIG. 3 is a plot of AC power used to power an optical receiver that can be produced by the p-n junction 50 of the device structure depicted in FIG. 1. In the function of an optical receiver, the material stack including the p-n junction 50 for the device 100 can receive optical signals up to multi-bit/second. For example, the optical receiver employing the p-n junction 50 of the device 100 depicted in FIG. 1 can receive signals ranging from 1 Mb/s to 50 Mb/s. In another example, the optical receiver employing the p-n junction 50 of the device 100 can receive signals ranging from 1 Mb/s to 10 Mb/s. In yet another example, the optical receiver employing the p-n junction 50 of the device 100 can receive signals ranging from 1 Mb/s to 5 Mb/s. In some embodiments, the power needed for the p-n junction 50 to function as an optical receiver is only a few micro-watts, which is a small fraction of the DC power that can be produced by the p-n junction 50 functioning as a photovoltaic device. In FIG. 3 plot line 201 depicts output signal from the optical receiver. In FIG. 3 plot line 202 depicts input modulated light signal. FIG. 4 is a plot of AC power as used to power an optical receiver, as depicted in FIG. 1, and a plot of DC power as produced by the photovoltaic device, as depicted in FIG. 1. In some embodiments, the DC power is always on for applications of using the device 100 without a battery. The DC power is identified by the plot having reference number 204. In the embodiment depicted in FIG. 4, the DC voltage produced by the p-n junction 50 is equal to 1.7 V, and the current of the p-n junction 50 is equal to 141 micro amps. This is the power that is generated by the p-n junction 50 of the device 100 depicted in FIG. 1, in which the p-n junction is functioning as a photovoltaic device. The AC power is identified by the plot having reference number 203. The AC power is the power that is used to power the optical receiver function of the p-n junction 50. The AC power may be equal to 0.5V. The AC power that is plotted in FIG. 4 may have a current that can be equal to +/−20 micro amps. The AC signal may have a frequency of 100 KHz. FIG. 4 illustrates that the AC power that can be needed to run the optical receiver component of the p-n junction 50 for the combination photovoltaic cell and optical receiver device that is provided by the device 100 depicted in FIG. 1 is substantially less than the power that is produced by the photovoltaic cell component of the p-n junction 50 for the combination photovoltaic cell and optical receiver device.

Figure 5:
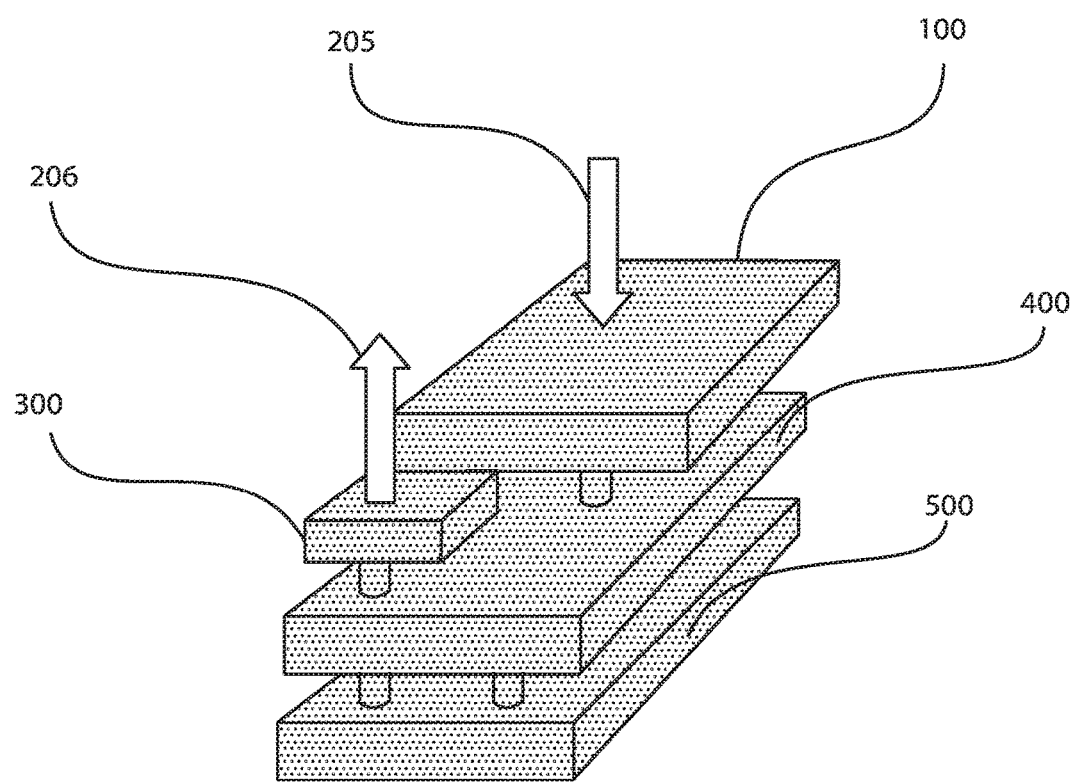
FIG. 5 is a pictorial representation of a device including a combination photovoltaic device and optical receiver comprising a p-n junction of type III-V semiconductor material layers, a light emitting diode for transmitting data, and a processor coupled to a memory, in accordance with one embodiment of the present disclosure.

FIG. 5 is a pictorial representation of a device 600 including a combination photovoltaic device and optical receiver 100 comprising a p-n junction of type III-V semiconductor material layers 50, a light emitting diode for transmitting data 300, and a processor 400 coupled to a memory device 500.

The combination photovoltaic device and optical receiver 100 may include a p-n junction 50 of type III-V semiconductor material layers, wherein the p-n junction 50 produces power in response to the application of a wavelength of light for powering an optical receiver provided by the p-n junction for receiving data 205. The combination photovoltaic device and optical receiver 100 that is depicted in FIG. 5 has been described above in more detail with reference to FIG. 1.

The photovoltaic device component of the combination photovoltaic device and optical receiver 100 may produce power through light absorbed by the p-n junction 50, in which the power produced by the photovoltaic device component, e.g., photovoltaic cell, ranges from 1.5 volts DC to 2.0 volts DC. In some embodiments, the power produced by the photovoltaic device component is sufficient for powering the optical receiving component, powering the LED 300, powering the processor 400, and powering the memory 500.

The data 205 transmitted to the p-n junction 50 providing the optical receiver may be in the form of light pulses. The optical receiver may be a photodiode provided by the p-n junction. For example, when biased correctly the photodiode can pass about a milliamp of current for each milliwatt of optical power falling on the junction, i.e., p-n junction. The optical receiver can receive signals up to multi-Mbit/sec. The power for powering the optical receiver is 10 microwatt or less, which can be provided by the p-n junction functioning as a photovoltaic.

Referring to FIG. 5, the device 600 may further include a LED 300 for transmitting optical signals, i.e., transmitting data 206. A light-emitting diode (LED) is a two-lead semiconductor light source. It is a p-n junction diode that emits light when activated. When a suitable voltage is applied to the leads, electrons are able to recombine with electron holes within the device, releasing energy in the form of photons. LEDs can converting electrical signals to optical. Current that can be provided from the photovoltaic device component of the combination photovoltaic device and optical receiver 100 to produce current pulses to generate a light pulse using the LED 300 for transmitting the data 206. The LED 300 can have either a lens for transmitting data 206 via free-air, or a connector for fiber optics or a pigtail directly coupled to a fiber pigtail suitable for splicing or connector to a fiber system.

Referring to FIG. 5, the device 600 may further include a processor 400 coupled to a memory device 500, the processor 400 being configured to control the electrical communication with the light emitting diode 300 and the combination photovoltaic device and optical receiver 100. The processing system 100 may include at least one transistor (can be referred to as hardware processor or CPU) to execute instructions stored on the memory 500 for receiving data 205 with the optical receiver component of the combination photovoltaic device and optical receiver 100 and/or for sending data 206 with the LED 300. The memory 500 can also include portions for storing data communications 205, 206. The memory 500 is a structure in which the electrical state can be altered and then retained in the altered state, in this way a bit of information can be stored. Examples of memory 500 include Read Only Memory (ROM), a Random Access Memory (RAM) and flash memory.

In another embodiment, a method for receiving optical data is provided, as illustrated in the flow chart depicted in FIG. 6. The method may begin with providing a material stack including p-n junction 50 of type III-V semiconductor material layer having a microscale footprint on a supporting substrate 10, wherein the material stack provides a photovoltaic device and an optical receiver. The method may begin with forming the material layers for the p-n junction 50, and the window layer 75. The type III-V semiconductor material layers may be formed using a deposition process, such as chemical vapor deposition (CVD), and in some embodiments may include an epitaxial growth process. In some embodiments, at least one layer of the type III-V semiconductor materials, e.g., aluminum gallium arsenide and/or gallium arsenide, can be formed using a low hydrogen deposition process. The term "low hydrogen" denotes that the deposition step has a maximum hydrogen content of $1 \times 10^{18}$ cm$^{-3}$. The deposition process for providing a low-hydrogen content could be metal organic chemical vapor deposition (MOCVD) or molecular beam epitaxy (MBE).

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The material layers for the emitter layer 51 of the p-n junction 50, and the base layer 52, may be doped n-type or p-type using in situ doping. By "in-situ" it is meant that the dopant that provides the conductivity type of the material layer, e.g., material layer that contributes to providing a junction, is introduced as the material layer is being formed.

It is further noted that the BSF layers 40, the buffer layer 30, and the supporting substrate 10 may also be formed using epitaxial deposition, e.g., via chemical vapor deposition, in combination with in situ doping.

In some embodiments, the material layers deposited for the material stack including the p-n junction 50 may be patterned and etched to provide the geometry of the stack of semiconductor materials that are depicted in FIG. 1. In some embodiments, the pattern and etch process steps performed at this stage of the process flow may determine the foot print, i.e., width W1 and depth dimension, for each of the combination photovoltaic devices and optical receivers 100. For example, a photoresist mask may be formed on the uppermost semiconductor layer, e.g., the window layer 75. The photoresist mask may be formed by applying a photoresist layer, exposing the photoresist layer to a pattern of radiation, and then developing the pattern into the photoresist layer utilizing a resist developer. The exposed portions of the semiconductor material layers that provide the window layer 75, the p-n junction 50, the back surface field layer 40 and the buffer layer 30 may then be etched using an etch process, such as an anisotropic etch, e.g., reactive ion etch (RIE), or an isotropic etch, such as a wet chemical etch. In some embodiments, the etch process may be selective to the supporting substrate 10. In one embodiment, the footprint of the etched device is equal to 100 microns by 100 microns.

Thereafter, the contacts 20a, 20b may be formed to each of the window layer 75 and supporting substrate 10 using deposition, photolithography and etching processes. In some embodiments, the contacts 20a, 20b may include a semiconductor portion, such as a doped III-V semiconductor material, e.g., n-type and/or p-type gallium arsenide (GaAs) and a metal contact upper layer. As noted above, a semiconductor contact layer may be formed on the upper surface of the window layer 75 that provides the semiconductor portion of the contacts 20a, 20a' to the window layer 75. The buffer layer 30 may be patterned to provide the semiconductor portion of the contacts 20b to the supporting substrate 10. The metal contact upper layer for the contacts 20a, 20b may be deposited using a physical vapor deposition (PVD) process. The PVD process may include plating, electroplating, electroless plating and combinations thereof. The deposited metal layers may be patterned and etched, along with the underlying semiconductor portions, using photolithography and etching to provide the desired geometry of the contacts 20a, 20b.

Once the combination photovoltaic device and optical receiver 100 has been formed, the device can receive a wavelength with the p-n junction 50, wherein the wavelength of light when absorbed by the p-n junction 50 of the material stack provides a power via the photovoltaic device component. In some embodiments, when the p-n junction 50 is composed of gallium arsenide layers the wavelength of light absorbed by the photovoltaic device components may range from 300 nm to 900 nm. In some other embodiments, the wavelength of light absorbed by the p-n junction 50 can range from 400 nm to 850 nm. In some embodiments, the power produced by the photovoltaic component of the p-n junction 50 of the combination photovoltaic device and optical receiver 100 ranges from 1.5 volts DC to 2.0 volts DC. In some embodiments the voltage produced by the photovoltaic component can provide power for the optical receiver, a light emitting diode, and processors and memory devices.

The method may continue with receiving optical signals with the optical receiver component of the combination photovoltaic device and optical receiver 100. The optical signals may be light based signals that can be transmitted to the optical receiver using a light source, such as a laser, fiber optic or any other light source that is containing a data communication. The wavelength of light for the data transmissions 35 received by the optical receiver may range from 400 nm to 870 nm for GaAs based device. The wavelength of the optical power source and the optical signal can be the same or different.

The optical receiver receives signals up to multi-Mbit/sec. In one example, the optical receiver employing the p-n junction 50 of the device 100 can receive signals ranging from 1 Mb/s to 10 Mb/s. In yet another example, the optical receiver employing the p-n junction 50 of the device 100 can receive signals ranging from 1 Mb/s to 5 Mb/s. The optical receiver can be powered by the power produced by the photovoltaic device. For example, the power for powering the optical receiver can be 10 microwatt or less.

In some embodiments, the data communications 205 received by the optical receiver component of the combination photovoltaic device and optical receiver 100 can be stored in the memory 500. As illustrated in FIG. 5, memory 500 may be integrated with the combination photovoltaic device and optical receiver 100 by being integrated through a processor 400. The memory 500 and processor 400 may be formed on the same supporting substrate 10 that houses the combination photovoltaic device and optical receiver 100.

In some embodiments, the method may further include transmitting data using the LED 300. The LED 300 may also be formed on the same supporting substrate 10 that houses the combination photovoltaic device and optical receiver 100. The LED 300 may transmit electrical communications using the instructions and data stored on the memory 500 executed through the processor. In some embodiments, the LED 300 can transmit signals up to multi-Mbit/sec. In one example, the LED 300 can transmit signals at a rate ranging from 1 Mb/s to 10 Mb/s. In yet another example, the LED 300 can transmit signals at a rate ranging from 1 Mb/s to 5 Mb/s.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a PHOTOVOLTAIC CELL AS ENERGY SOURCE AND DATA RECEIVER (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A device comprising:
a p-n junction of first type III-V semiconductor material layers, the p-n junction constructed from a single emitter layer and a single base layer, the single base layer in direct contact with a back surface field layer;
a window layer of a second type III-V semiconductor material on the light receiving end of the p-n junction, wherein the p-n junction produces power in response to the application of a wavelength of light for powering an optical receiver provided by the p-n junction; and
a first set of electrodes in direct contact with the window layer and a second set of electrodes in direct contact with a buffer layer, the buffer layer disposed between a substrate and the back surface field layer,
wherein the emitter layer has a thickness that is less than a thickness of the window layer and wherein the device provides a voltage at open circuit equal to 1.18 Volts.

2. The device of claim 1, wherein the single emitter layer has a thickness of 100 nm, the single base layer has a thickness of 1.5 µm, and the window layer has a thickness of 1 µm.

3. The device of claim 1, wherein the first set of electrodes are a bilayer of a III-V semiconductor material and a metal-containing layer.

4. The device of claim 1, wherein the window layer is composed of a same material as the back surface field layer.

5. The device of claim 1, wherein the emitter layer is comprised of a first gallium and arsenic containing layer doped to a first conductivity type that is in direct contact with the window layer; and the base layer is comprised of a second gallium and arsenic containing layer having a second conductivity type.

6. The device of claim 1, wherein the window layer is composed of a semiconductor material having a greater band gap than material layers of the p-n junction.

7. A device comprising:
- a combination photovoltaic device and optical receiver comprising a p-n junction of type III-V semiconductor material layers, wherein the p-n junction produces power in response to the application of a wavelength of light for powering an optical receiver provided by the p-n junction for receiving data, the p-n junction constructed from a single emitter layer and a single base layer, the single base layer in direct contact with a back surface field layer;
- a light emitting diode for transmitting data;
- a processor coupled to a memory, the processor being configured to control the electrical communication with the light emitting diode and the combination photovoltaic device and optical receiver; and
- a first set of electrodes in direct contact with a window layer and a second set of electrodes in direct contact with a buffer layer, the buffer layer disposed between a substrate and the back surface field layer,
- wherein the emitter layer has a thickness that is less than a thickness of the window layer and wherein the device provides a voltage at open circuit equal to 1.18 Volts.

8. The device of claim 7, wherein the single emitter layer has a thickness of 100 nm, the single base layer has a thickness of 1.5 µm, and the window layer has a thickness of 1 µm.

9. The device of claim 7, wherein the first set of electrodes are a bilayer of a III-V semiconductor material and a metal-containing layer.

10. The device of claim 7, wherein a power for said powering the optical receiver is 10 microwatt or less.

11. The device of claim 7, wherein the emitter layer is comprised of a first gallium and arsenic containing layer doped to a first conductivity type that is in direct contact with the window layer; and the base layer is comprised of a second gallium and arsenic containing layer having a second conductivity type.

12. The device of claim 7, wherein the window layer is composed of a same material as the back surface field layer.

13. A method for receiving optical data comprising:
- providing a material stack including p-n junction of type III-V semiconductor material layer having a microscale footprint on a supporting substrate, the p-n junction constructed from a single emitter layer and a single base layer, the single base layer in direct contact with a back surface field layer, and wherein the material stack provides a photovoltaic device and an optical receiver;
- receiving a wavelength with the p-n junction, wherein the wavelength of light when absorbed by the p-n junction of the material stack provides a power via the photovoltaic device;
- receiving optical signals with the optical receiver, wherein the optical receiver is powered by the power produced by the photovoltaic device; and
- disposing a first set of electrodes in direct contact with a window layer and a second set of electrodes in direct contact with a buffer layer, the buffer layer disposed between a substrate and the back surface field layer,
- wherein the emitter layer has a thickness that is less than a thickness of the window layer and wherein the photovoltaic device provides a voltage at open circuit equal to 1.18 Volts.

14. The method of claim 13, wherein the single emitter layer has a thickness of 100 nm, the single base layer has a thickness of 1.5 µm, and the window layer has a thickness of 1 µm.

15. The method of claim 13, wherein the first set of electrodes are a bilayer of a III-V semiconductor material and a metal-containing layer.

16. The method of claim 13, wherein a power for said powering the optical receiver is 10 microwatt or less.

17. The method of claim 13, wherein the emitter layer is comprised of a first gallium and arsenic containing layer doped to a first conductivity type that is in direct contact with the window layer; and the base layer is comprised of a second gallium and arsenic containing layer having a second conductivity type.

18. The method of claim 13, wherein the window layer is composed of a same material as the back surface field layer.

19. The method of claim 13, wherein a wavelength of light for the signal being received is different than the wavelength that provides said power via the photovoltaic device.

20. The method of claim 13, wherein a wavelength of light for the signal being received is the same as the wavelength that provides said power via the photovoltaic device.

* * * * *